United States Patent
Zheng et al.

(10) Patent No.: US 7,524,199 B2
(45) Date of Patent: Apr. 28, 2009

(54) PICK-AND-PLACE CAP FOR SOCKET ASSEMBLY

(75) Inventors: Tieyu Zheng, Chandler, AZ (US); Xiaoqing Ma, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/863,857

(22) Filed: Sep. 28, 2007

(65) Prior Publication Data
US 2009/0088015 A1  Apr. 2, 2009

(51) Int. Cl.
H01R 13/44 (2006.01)
(52) U.S. Cl. ...................................... 439/135
(58) Field of Classification Search ................. 439/135, 439/327, 357
See application file for complete search history.

(56) References Cited

U.S. PATENT DOCUMENTS

| | | | |
|---|---|---|---|
| 6,877,990 B2 | 4/2005 | Liao et al. | |
| 6,905,353 B2 | 6/2005 | Ma et al. | |
| 6,945,798 B2 | 9/2005 | McClellan et al. | |
| 6,971,890 B2 | 12/2005 | Ma | |
| 7,004,768 B2 | 2/2006 | Ma et al. | |
| 7,121,865 B2 | 10/2006 | Bryant | |
| 7,429,182 B1 | 9/2008 | Zheng et al. | |
| 7,455,526 B1 | 11/2008 | Ila | |
| 2004/0053524 A1* | 3/2004 | Trout | 439/135 |
| 2004/0219808 A1* | 11/2004 | McClellan et al. | 439/135 |
| 2005/0208813 A1* | 9/2005 | Trout et al. | 439/326 |

OTHER PUBLICATIONS

Office Action Received for U.S. Appl. No. 11/863,810, mailed on Mar. 24, 2008, 8 Pages.
Notice of Allowance Received for U.S. Appl. No. 11/877,919, mailed on May 5, 2008, 7 Pages.
Notice of Allowance Received for U.S. Appl. No. 11/863,810, mailed Jul. 17, 2008; 8 pages.

* cited by examiner

Primary Examiner—Jean F Duverne
(74) Attorney, Agent, or Firm—Grossman, Tucker, Perreault & Pfleger, PLLC

(57) ABSTRACT

Disclosed is a socket assembly for electrically engaging an Integrated Circuit (IC) package with a printed circuit board. The socket assembly includes a socket body and a Pick-and-Place (PnP) cap. The socket body is mounted on the printed circuit board. Further, the PnP cap is capable of detachably mounting on the socket body. An upper surface of the PnP cap includes a raised portion with multiple chamfered portions projecting out from the raised portion. The multiple chamfered portions enable easier detachment of the PnP cap from the socket body.

11 Claims, 6 Drawing Sheets

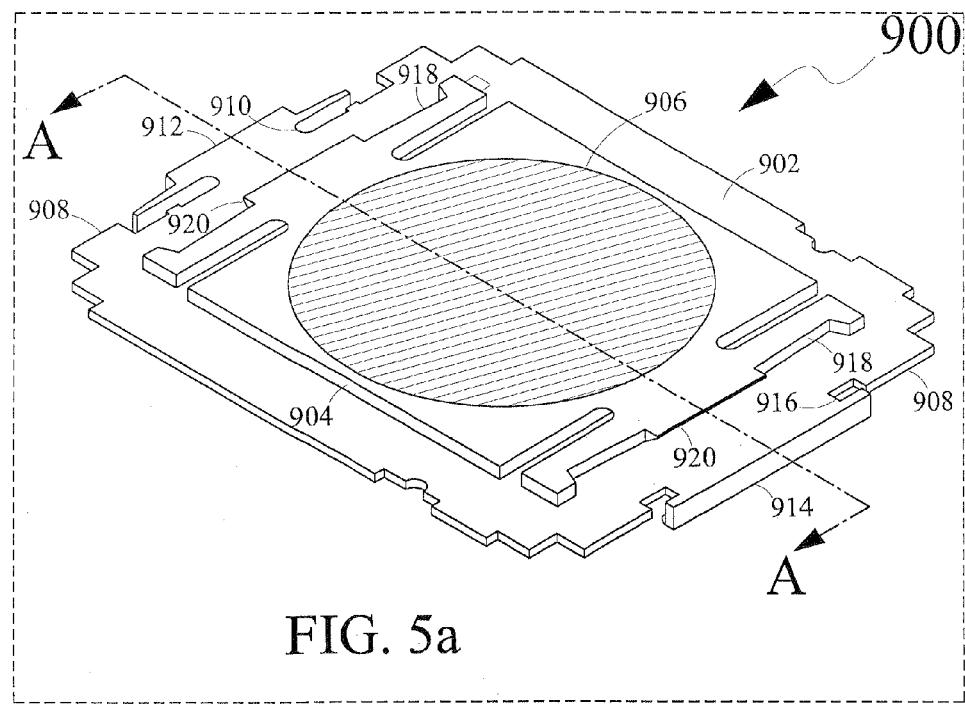
FIG. 5a
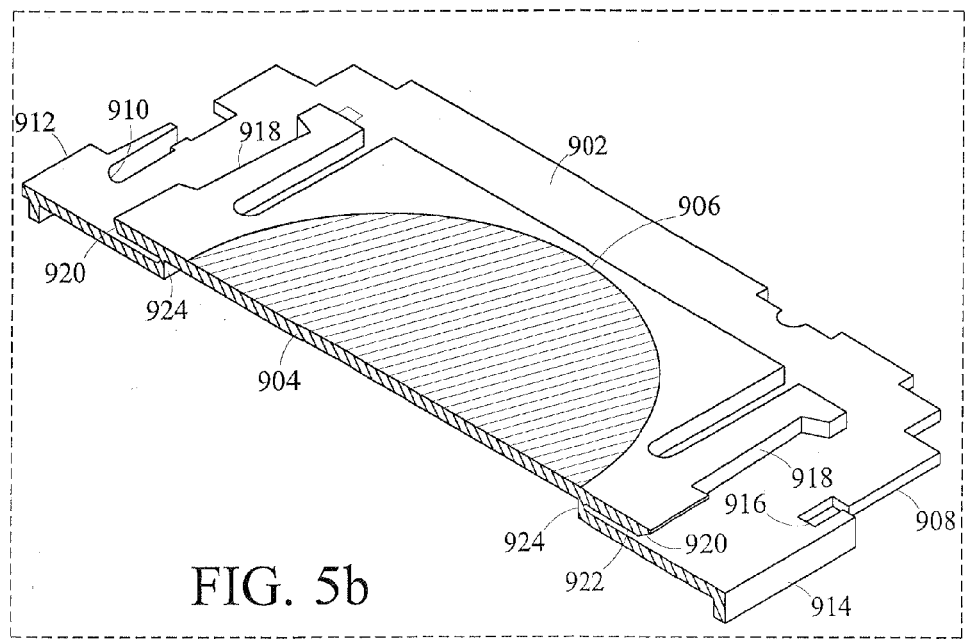
FIG. 5b
FIG. 5

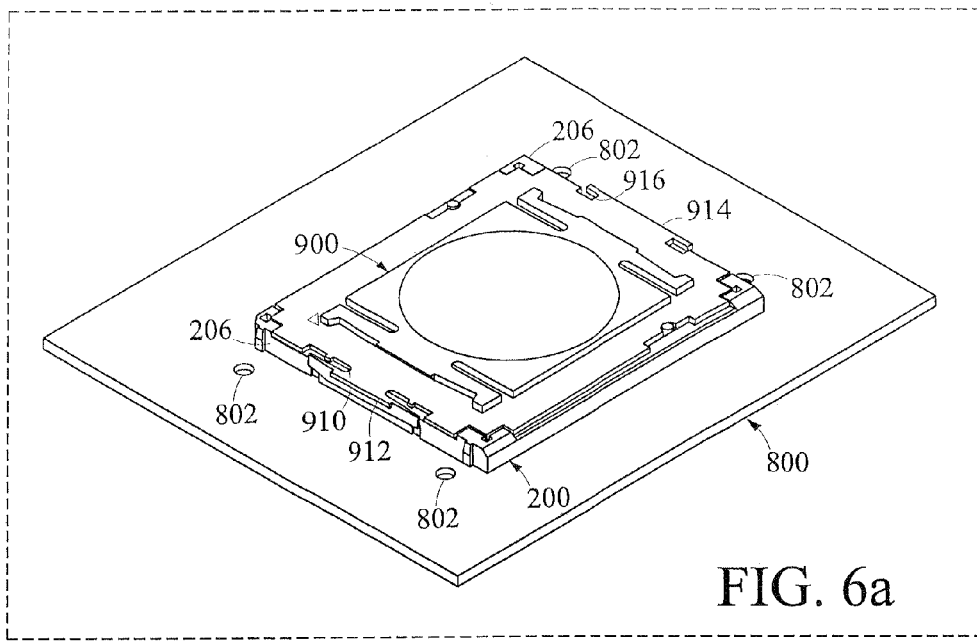
FIG. 6a
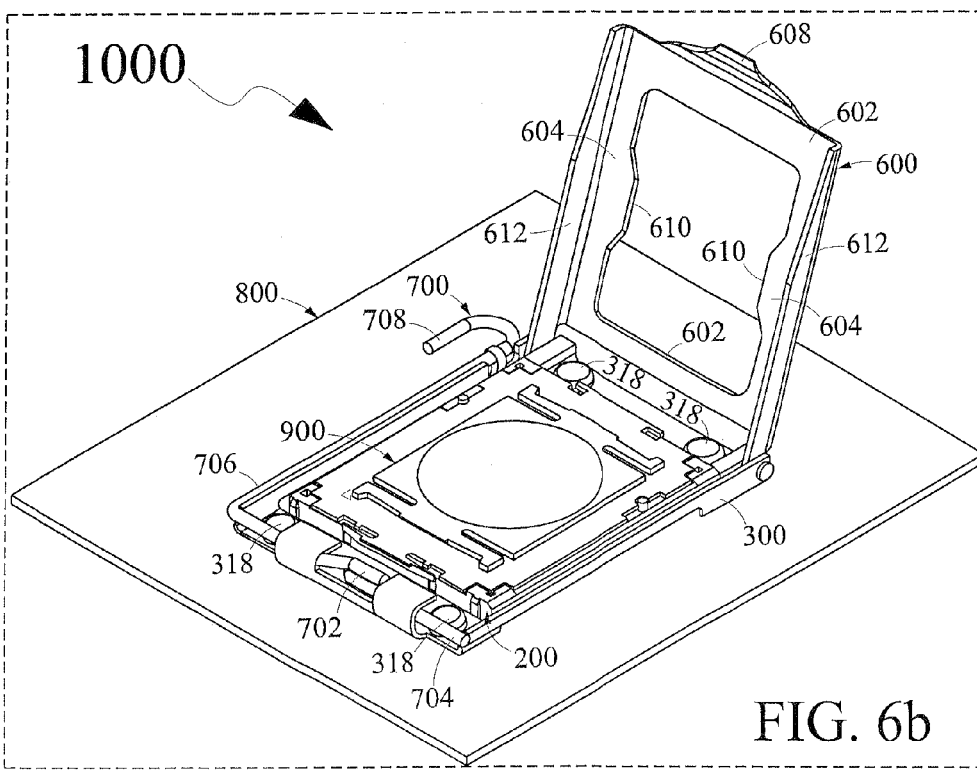
FIG. 6b
FIG. 6

PICK-AND-PLACE CAP FOR SOCKET ASSEMBLY

FIELD OF THE DISCLOSURE

The present disclosure relates to a socket assembly for an Integrated Circuit (IC) package, and, more particularly to a pick-and-place (PnP) cap attached to a socket body of a socket assembly.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

FIG. 5 illustrates an isometric view of a PnP cap, according to an exemplary embodiment of the present disclosure; and FIG. 6 depicts a pick-and-place cap mounted on a socket body and a loading mechanism mounted on the socket body, according to an exemplary embodiment of the present disclosure.

Like reference numerals refer to like parts throughout the description of several views of the drawings.

DETAILED DESCRIPTION OF THE DISCLOSURE

For a thorough understanding of the present disclosure, refer to the following detailed description, including the appended claims, in connection with the above-described drawings. Although the present disclosure is described in connection with exemplary embodiments, the disclosure is not intended to be limited to the specific forms set forth herein. It is understood that various omissions and substitutions of equivalents are contemplated as circumstances may suggest or render expedient, but these are intended to cover the application or implementation without departing from the spirit or scope of the claims of the present disclosure. Also, it is to be understood that the phraseology and terminology used herein is for the purpose of description and should not be regarded as limiting. The terms "first," "second," and the like, herein do not denote any order, quantity, or importance, but rather are used to distinguish one element from another, and the terms "a" and "an" herein do not denote a limitation of quantity, but rather denote the presence of at least one of the referenced item.

Figure 1:
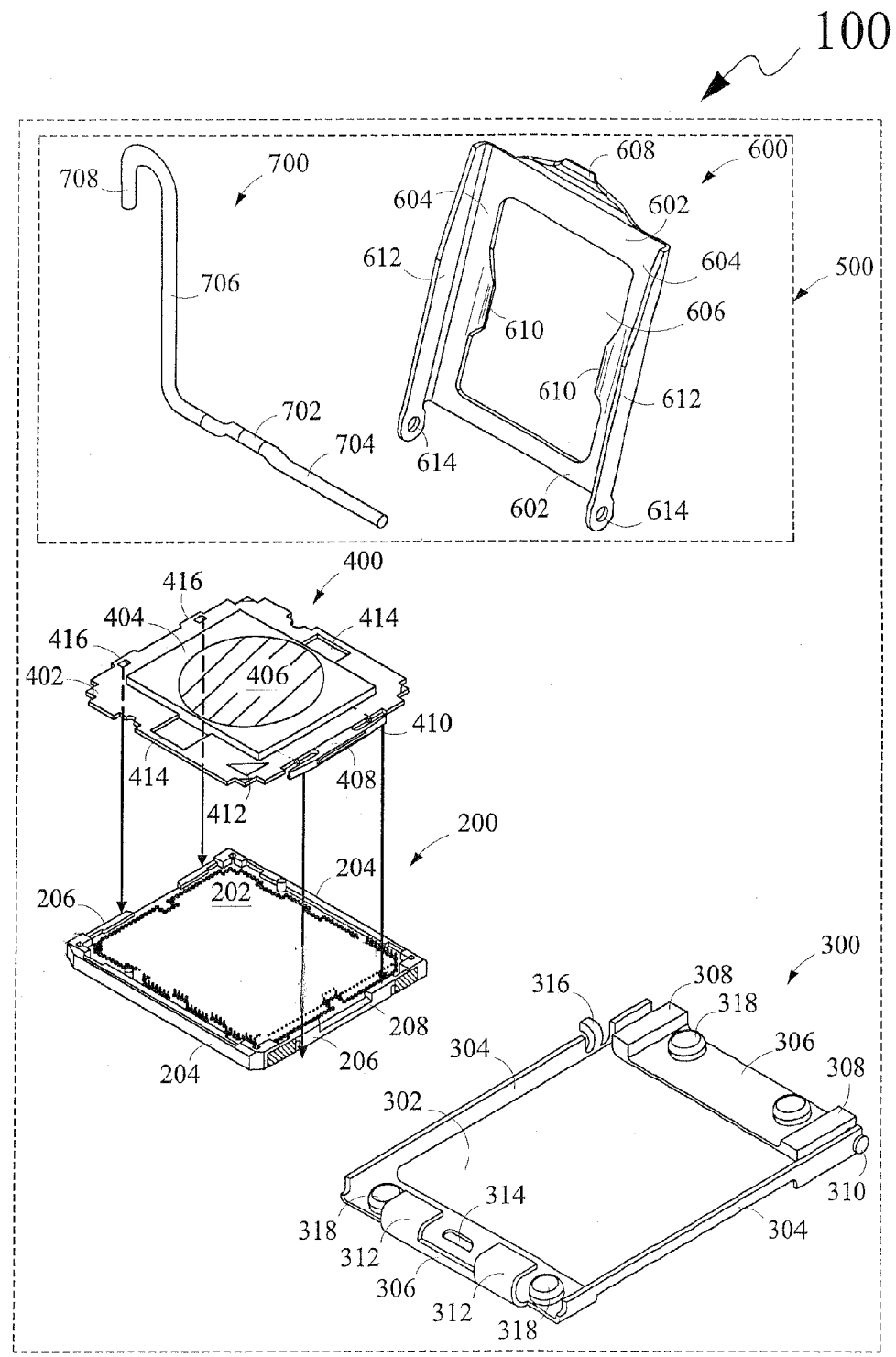
FIG. 1 is an exploded isometric view of a socket assembly.

FIG. 1 is an exploded isometric view of a socket assembly 100. The socket assembly 100 includes a socket body 200, a enabling frame 300, a prior-art PnP cap 400 and a loading mechanism 500. The prior-art PnP cap 400 is hereinafter referred to as the PnP cap 400. The loading mechanism 500 includes a loading plate 600 and a lever 700. The enabling frame 300 includes a central opening 302 for receiving the socket body 200. The enabling frame 300 with the socket body 200 received therein, is surface mounted on a printed circuit board (not shown in FIG. 1). The PnP cap 400 may be detachably engaged to peripheral walls of the socket body 200 and covers a first surface 202 of the socket body 200. The loading mechanism 500 may be mounted on the PnP cap 400 covering the first surface 202 of the socket body 200.

The socket body 200 includes two side walls 204 opposite and spaced apart and two end walls 206 connecting the two side walls 204 in a manner such that the first surface 202, the two side walls 204 and the two end walls 206 configure a receiving space therebetween. Such an arrangement of the socket body 200, for example, configures a rectangular structure capable of accommodating an Integrated Circuit (IC) package (not shown in FIG. 1) therein. The socket body 200 may be surface mounted on a printed circuit board (PCB) with the first surface 202 facing away from the PCB. The first surface 202 includes an array of contacts configured to enable electrical connection when in contact with contact pads on an underside of the IC package (not shown in the figure). The array of contacts may be of any suitable material such as gold-plated copper and the like. The array of contacts may be arranged in a fashion facilitating electrical connectivity with the contact pads of the IC package. For example, the array of contacts may be arranged in a grid array fashion.

The first surface 202 of the socket body 200 may be covered by the PnP cap 400 for protecting the array of contacts from contamination from external elements such as air, human-touch and the like. In one embodiment, the PnP cap 400 is configured as a rectangular structure including an upper surface 402 having a raised portion 404 and correspondingly a lower surface (not shown) having a stepped cavity therein. The raised portion 404 configured by the stepped cavity at the lower surface prevents a planar surface of the PnP cap 400 from coming in contact with the first surface 202 of the socket body 200 when placed thereupon. Further, the raised portion 404 may have a circular smooth area 406 defined in the center of the raised portion 404. The circular smooth area 406 serves to provide sufficient smooth area to receive a suction force applied by a vacuum pump suction for picking up the PnP cap 400 (along with the socket body 200) during a surface mounting process. The PnP cap 400 includes a plurality of peripheral edges that are opposite and spaced apart in a manner such that the plurality of peripheral edges forms a rectangular structure. The PnP cap 400 further includes a neck portion 408 extending from a peripheral edge (hereinafter refereed to as a lateral edge) of the plurality of peripheral edges of the PnP cap 400 supporting a protrusion 410.

Furthermore, one of the end walls 206 of the socket body 200 defines grooves 208. One of the grooves 208 may be configured to accommodate the neck portion 408 supporting the protrusion 410 extending from the PnP cap 400. The neck portion 408 supporting the protrusion 410 may be dimensioned in a manner such that the neck portion 408 fits the width of the one of the grooves 208, thereby latching the PnP cap 400 to the socket body 200. It will be evident to those skilled in the art that the plurality of peripheral edges of the PnP cap 400 may further include engagement features, such as a plurality of wedges and curved surface edges for coupling the PnP cap 400 to the socket body 200. For example, the PnP cap 400 may include a plurality of latches 416 for engaging into complementary features present on peripheral edges of the side walls 204 and the end walls 206 of the socket body 200.

The PnP cap 400 also includes a marker 412 to indicate the correct position of inserting the PnP cap 400 onto the socket body 200. Further, two openings 414 may be provided in the PnP cap 400 adjacent to the raised portion 404 and extending along the peripheral edges of the PnP cap 400. The openings 414 serve as ventilation openings and may improve the air flow into the socket body 200 when the PnP cap 400 is coupled to the socket body 200.

The enabling frame 300 includes two side walls 304 opposite and spaced apart and two end walls 306 connecting the two side walls 304 in a manner such that the two side walls 304 and the two end walls 306 configure the central opening 302 therebetween. The socket body 200 is housed in the central opening 302 of the enabling frame 300. One of the end walls 306 (hereinafter referred to as the rear end wall 306) has a stepped-down flat portion in its center configuring two raised portions 308 at ends connecting the two side walls 304. The two raised portions 308 and the side walls 304 define a gap for accommodating an end portion of the loading plate 600. Further, openings are provided in each of the two side walls 304, which may align with holes (not shown in FIG. 1) provided in each of the two raised portions 308. Nuts such as shaft 310 slide through the openings in the two side walls 304 in the direction of the two raised portions 308. Similar openings may be provided in the end portion of the loading plate 600 accommodated in the gap between the two side walls 304 and the two raised portions 308. The openings in the two side walls 304 may align with the openings in the end portion of the loading plate 600 and the nuts such as the shaft 310 may pass through the openings in the end portion of the loading plate 600 to pivotally hinge the loading plate 600.

Another end wall of the end walls 306 (hereinafter referred to as the front end wall 306) may have two protruding portions 312 extending above the enabling frame 300 and curving in towards the central opening 302, thereby configuring a gap for accommodating rotation of a shaft of the lever 700. A base of the front end wall 306 includes a groove 314 for accommodating a protruding edge of the lever 700. Further, the enabling frame 300 includes a chip portion 316 extending away from the central opening 302 to hold another shaft of the lever 700 parallel to the enabling frame 300. The chip portion 316 and the protruding edge will be explained in conjunction with the loading mechanism 500. The enabling frame 300 also includes screws 318 to engage with a back plate (not shown) through openings, such as punctured openings provided in the PCB.

Upon placing the PnP cap 400 covering the first surface 202 of the socket body 200, the loading mechanism 500 is mounted on the PnP cap 400. The loading plate 600 of the loading mechanism 500 may be pivotally connected to the rear end wall 306 of the enabling frame 300 and the lever 700 may be pivotally connected at the front end wall 306 of the enabling frame 300. The loading plate 600 and the lever 700 may rotate between a first position (hereinafter referred to as an open position) for removing the PnP cap 400 and receiving the IC package, and, a second position (hereinafter referred to as a closed position) for applying a downward force on the PnP cap 400 or on the IC package. The loading plate 600 includes a first pair of arms 602 opposite and spaced apart and a second pair of arms 604 connecting the first pair of arms 602 thereby configuring a central opening 606 therebetween. A first arm of the first pair of arms 602 bears a locking portion 608 extending away from the first arm. A pair of pressing portions 610 is configured on the second pair of arms 604 in a manner such that the pair of pressing portions 610 extends into the central opening 606. Further, the second pair of arms 604 includes two extended portions 612. Each extended portion of the extended portions 612 configured on an arm of the second pair of arms 604 is perpendicular to and extending away from the central opening 606, and tapers towards the first arm of the first pair of arms 602 bearing the locking portion 608. Each of the extended portions 612 includes openings such as opening 614 at an end portion. The end portion of the extended portions 612 are received into the gap defined by the two side walls 304 and the two raised portions 308. The openings such as the opening 614 align with the openings in the side walls 306 for receiving the nuts such as the shaft 310 for pivotally hinging the loading plate 600. The loading plate pivotally hinges about the nuts, such as the shaft 310 to assume one of the open position and the closed position. In the closed position, the loading plate is locked by means of the lever 700. The loading plate 600 is unlocked and rotated to assume the open position, thereby facilitating removal of the PnP cap 400. On removal of the PnP cap 400 and the insertion of the IC package, the pair of pressing portions 610 is capable of applying a downward force on the IC package in the closed position.

The locking portion 608 of the loading plate 600 is a curved surface which rests below a protruding edge 702 of a closing shaft 704 of the lever 700, thereby locking the loading plate 600 in a closed position. A driving shaft 706 is housed outside the enabling frame 300 and runs parallel to an outer periphery of one of the two side walls 304 including the chip portion 316. The chip portion 316 holds the driving shaft in a horizontal position parallel to the enabling frame 300. The driving shaft 706 of the lever 700 includes a u-shaped portion 708 which may be lifted from a horizontal position (closed position) to lift the protruding edge 702 of the closing shaft 704. Accordingly, the protruding edge 702 of the closing shaft 704 is lifted thereby unlocking the locking portion 608 of the loading plate 600 which may then be rotated to assume the open position. The closed position and the open position of the loading plate are further depicted in FIG. 3.

Figure 2A:
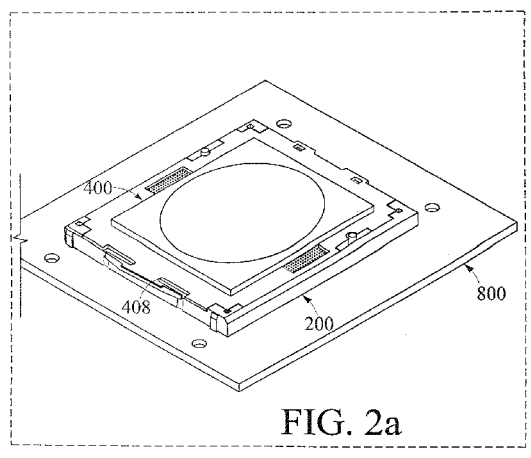
FIG. 2 depicts an arrangement of a prior art pick-and-place (PnP) cap mounted on a socket body of the socket assembly of FIG. 1 and a loading mechanism to be mounted on the arrangement.
Figure 2:
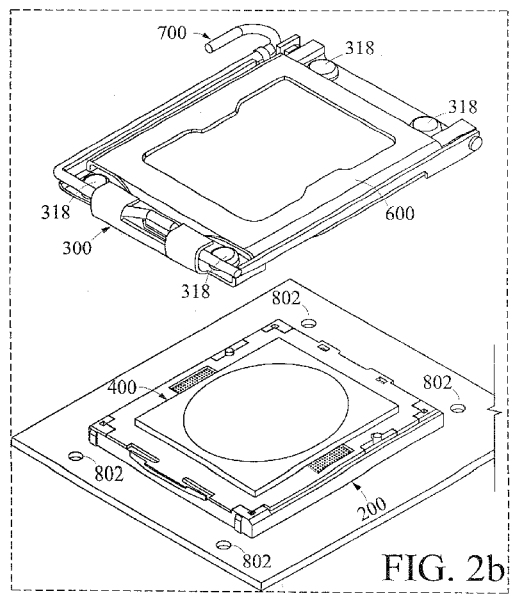

FIG. 2 depicts an arrangement of a prior art PnP cap 400 mounted on the socket body 200 of the socket assembly 100 of FIG. 1 and the loading mechanism 500 to be mounted on the arrangement. The arrangement of the PnP cap 400 mounted on the socket body 200 of the socket assembly 100 of FIG. 1 is depicted in FIG. 2a and the loading mechanism 500 to be mounted on the arrangement is depicted in FIG. 2b.

Figure 3:
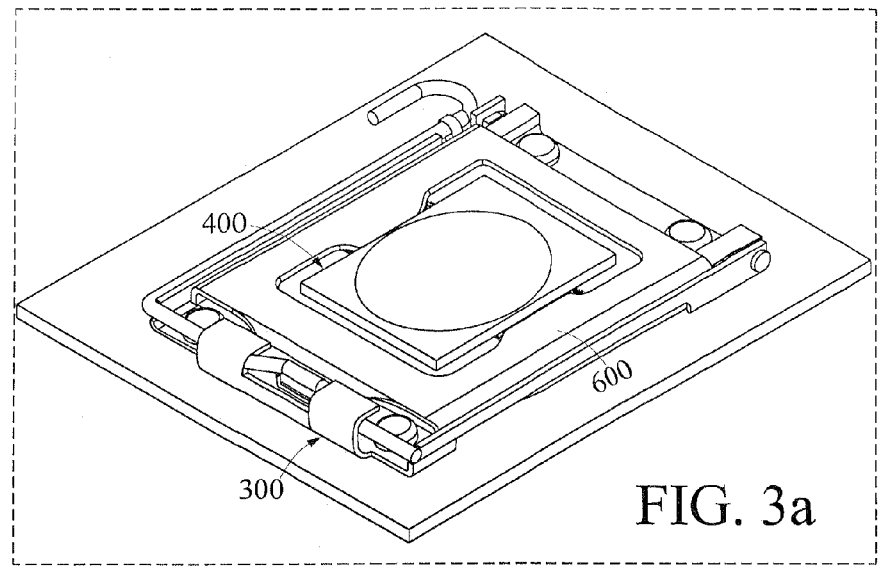
FIG. 3 depicts an assembled view of the socket assembly of FIG. 1 and an open position of a loading plate of the socket assembly.
Figure 3:
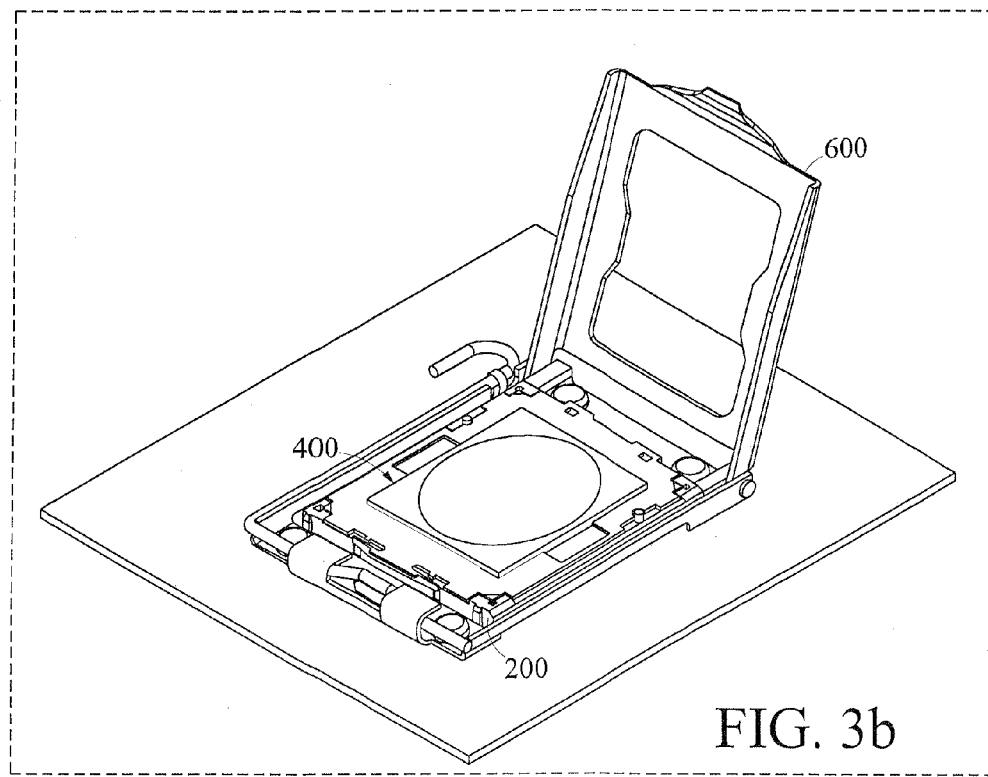

FIG. 2a depicts an isometric view of the PnP cap 400 mounted on the socket body 200. The socket body 200 is mounted on a printed circuit board (PCB) 800. As explained in conjunction with FIG. 1, the engagement features provided on the plurality of peripheral edges of the PnP cap 400 engage the PnP cap 400 to the socket body 200 of the socket assembly 100. The neck portion 408 extending out from the lateral edge of the plurality of peripheral edges is accommodated into one of the grooves 208 present on the socket body 200. As explained in FIG. 1, the plurality of wedges and/or the curved surface edges at the peripheral edges of the PnP cap 400 further secure the PnP cap 400 on to the socket body 200. FIG. 2b depicts mounting of the loading mechanism 500 over the PnP cap 400 covering the first surface 202 (not shown in the figure) of the socket body 200. As explained in conjunction with FIG. 2a, the socket body 200 and the PnP cap 400 covering the first surface 202 of the socket body 200 are mounted on the PCB 800. The loading mechanism 500 that includes the loading plate 600 and the lever 700, is shown coupled to the enabling frame 300 for visualization purpose. The loading plate 600 may be then mounted over the PnP cap 400. The loading mechanism 500 along with the enabling frame 300 is fastened to the PCB 800 by nuts such as the screws 318 on the enabling frame 300 passing through punctured holes such as the holes 802 configured on the PCB 800 to couple with studs on a back plate (not shown in FIG. 2b). An assembled view of the socket assembly 100 is depicted in FIG. 3a FIG. 3 depicts an assembled view of the socket assembly 100 of FIG. 1 and an open position of the loading plate 600 of the socket assembly 100. The assembled view of the socket assembly 100 is depicted in FIG. 3a and the open position of the loading plate 600 of the socket assembly 100 is depicted in FIG. 3b.

FIG. 3a depicts the socket assembly 100 of FIG. 1 assembled on the PCB 800 as explained in conjunction with FIG. 2a. The PnP cap 400 is detachably mounted over the socket body 200 to cover the first surface 202 of the socket body 200. Further, the loading plate 600 coupled to the enabling frame 300 is mounted over the PnP cap 400. The enabling frame 300 secures the socket body 200 firmly in position on the PCB 800 using nuts such as the screws 318 as explained in conjunction with FIG. 2b. The loading plate 600 depicted in the closed position in FIG. 3a may be switched to the open position as depicted in FIG. 3b.

FIG. 3b depicts the open position of the loading plate 600 of the socket assembly 100 of FIG. 1. As explained in conjunction with FIG. 1, the first surface 202 of the socket body 200 is covered by the PnP cap 400. The loading mechanism 500 including the loading plate 600 and the lever 700 is mounted on the PnP cap 400. The driving shaft 706 including the u-shaped portion 708 is rotated to lift the protruding edge 702 of the closing shaft 704 of the lever 700 thereby releasing the locking portion 608 of the loading plate 600. The loading plate 600 may then be raised to assume the open position. The open position of the loading plate 600 facilitates the removal of the PnP cap 400 for inserting the IC package into the receiving space of the socket body 200.

However, while removing the PnP cap 400 from the IC package 804, one or more latches (as illustrated by the plurality of latches 416 in FIG. 1) of the PnP cap 400 may get damaged, as the area available to hold the PnP cap 400 after mounting the loading mechanism 500 is very limited. Further, debris of the one or more latches that get damaged may contaminate the socket body 200, thereby damaging the array of contacts on the socket body 200. The removal of the PnP cap 400 and the insertion of the IC package are explained in conjunction with FIG. 4.

Figure 4:
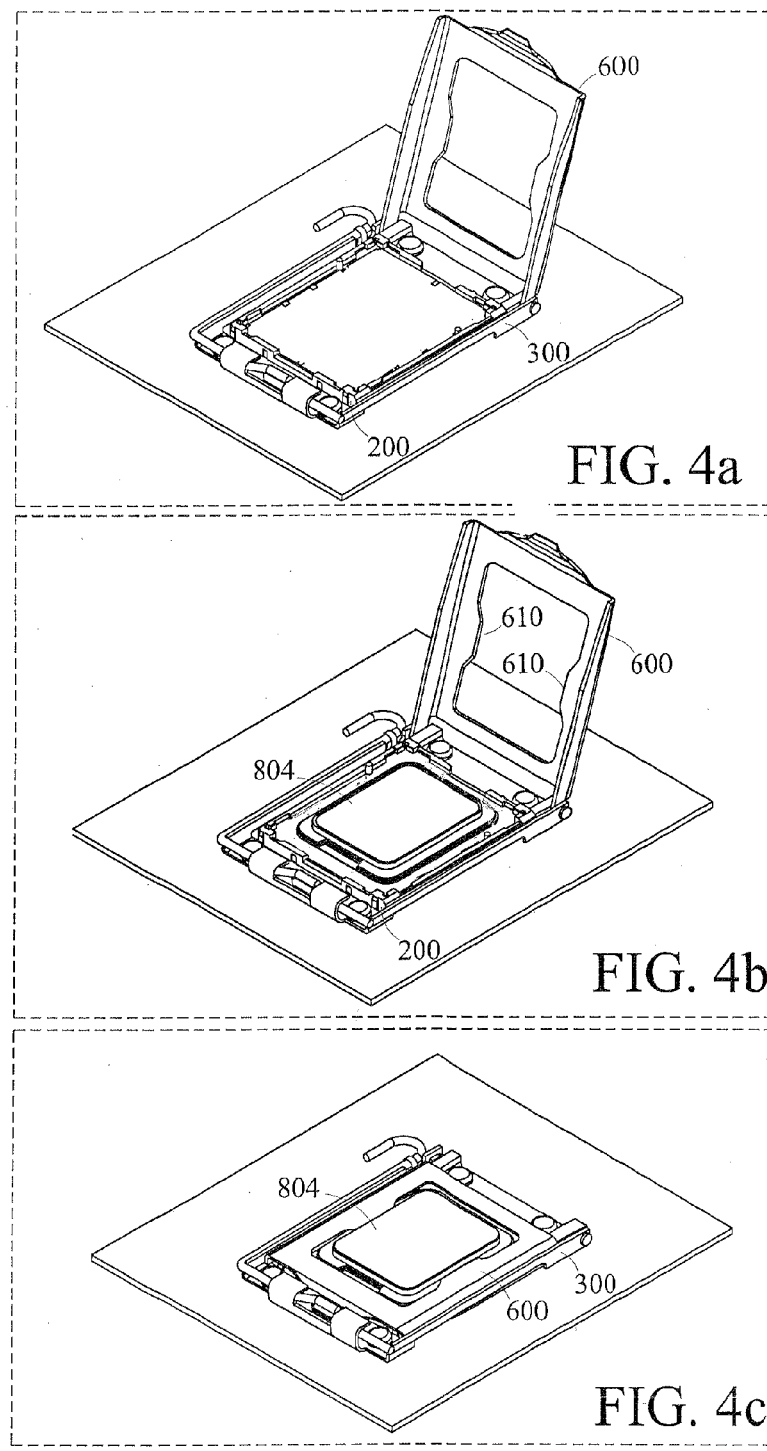
FIG. 4 depicts the arrangement of an Integrated Circuit (IC) package in a receiving space of the socket body of the socket assembly of FIG. 1.

FIG. 4 depicts the arrangement of an IC package 804 in a receiving space of the socket body of the socket assembly 100 of FIG. 1. FIG. 4a depicts the socket assembly 100 of FIG. 1 with the PnP cap 400 removed from over the first surface 202 of the socket body 200. The loading plate 600 is depicted in the open position, exposing the receiving space described in FIG. 1. The IC package 804 may then be loaded into the receiving space of the socket body 200, as shown in FIG. 4b. The loading plate 600 may then be lowered to assume the closed position to secure the IC package 804 as shown in FIG. 4c. As explained in conjunction with FIG. 1, the pair of pressing portions 610 of the loading plate 600 applies a downward force on the IC package 804 to enable sufficient electrical contact of the contact pads underneath the IC package 804 with the array of contacts on the first surface 202 of the socket body 200.

FIG. 5 illustrates an isometric view of a PnP cap 900, according to an embodiment of the present disclosure. FIG. 5a is an isometric view highlighting various components of the PnP cap 900 and FIG. 5b is a view of a cross section of the PnP cap 900 along a line A-A.

The PnP cap 900 may be used in conjunction with a socket body such as the socket body 200 for covering a first surface of the socket body as explained in conjunction with FIG. 1. A loading plate such as the loading plate 600 may be mounted on the PnP cap 900. The PnP cap 900 includes an upper surface 902 with a raised portion 904. The raised portion 904 may have a circular smooth area 906 to facilitate the application of suction force by a vacuum pump suction for picking up the PnP cap 900 (along with the socket body 200) during the surface mounting process. Further, the PnP cap 900 includes a plurality of peripheral edges such as a peripheral edge 908 (hereinafter referred to as a lateral edge 908). The PnP cap 900 includes a neck portion 910 extending from the lateral edge 908 supporting a protrusion 912. The neck portion 910 may be accommodated in one of the grooves 208 of the socket body 200. The protrusion 912 serves as latch to couple the PnP cap 900 to the socket body 200.

Further, a protrusion 914 may be provided on a lateral edge opposite and spaced apart to the lateral edge 908 and may be supported by a neck portion 916 to further latch the PnP cap 900 to the socket body. Thus, a plurality of latches on the plurality of peripheral edges engages the PnP cap 900 to socket body 200. The raised portion 904 may also include a second plurality of latches 918 projecting out from at least one lateral edge of the raised portion 904.

In an embodiment of the present disclosure, the second plurality of latches 918 may be designed to latch on to the central opening 606 of the loading plate 600 on an outer surface (facing away from the socket body) of the loading plate 600. Thus the PnP cap 900 may be mounted on the socket body 200 using the first plurality of latches and may be mounted on an outer surface of the loading plate using the second plurality of latches 918.

The raised portion 904 may be designed with multiple chamfered portions such as a chamfered portion 920. Each of the multiple chamfered portions project out from the raised portion 904 and may be configured to provide more clearance space to human fingers to grip firmly the raised portion 904 of the PnP cap 900 enabling detachment of the PnP cap 900 from the socket body 200.

In accordance with an embodiment of the present disclosure, the multiple chamfered portions, such as the chamfered portion 920 may be disposed on a lateral edge of a latch of the second plurality of latches 918. At least one latch of the second plurality of latches 918 may be designed to include at least one chamfered portion of the multiple chamfered portions at a bottom surface 922 of the at least one latch (depicted in FIG. 5b).

FIG. 5b is a view of a cross section of the PnP cap 900 along the line A-A (depicted in FIG. 5a). The raised portion 904 on the upper surface defines a stepped cavity 924 on the lower surface (not shown in this figure). The stepped cavity 924 on the lower surface of the PnP cap 900 may be configured to provide a clearance area between the socket body 200 and the lower surface of the PnP cap 900 when the PnP cap is mounted on the socket body 200. The bottom surface 922 of the at least one latch of the second plurality of latches 918 is chamfered as depicted in the figure. The multiple chamfered portions, such as the chamfered portion 920, enable detachment of the PnP cap 900 from the socket body 200 by providing more clearance space to grip firmly the raised portion 904 of the PnP cap 900 enabling detachment of the PnP cap 900 from the socket body 200. In an embodiment, the PnP cap 900 may be manually detached from the socket body 200, thus providing more clearance area and a better grip to human fingers. In another embodiment, removal of the PnP cap 900 may be performed by a machine, for example, a PnP machine.

FIG. 6 depicts the PnP cap 900 mounted on the socket body 200 and the loading mechanism 500 mounted on the socket body 200, according to an exemplary embodiment of the present disclosure. The socket body 200, the enabling frame 300, the PnP cap 900 and the loading mechanism 500 configure a socket assembly 1000. The arrangement of the PnP cap 900 mounted on the socket body 200 of the socket assembly 1000 is depicted in FIG. 6a and the loading mechanism 500 mounted on the arrangement is depicted in FIG. 6b.

FIG. 6a depicts an isometric view of the PnP cap 900 mounted on the socket body 200. The socket body 200 is surface mounted on the PCB 800 as explained in conjunction with FIG. 2.

As explained in conjunction with FIG. 5a, the first plurality of latches including the protrusion 912 and the protrusion 914 latch onto the grooves 208 (not shown in the figure) provided on the two end walls 206 of the socket body 200 by means of the neck portion 910 and the neck portion 916 respectively. Further, complementary engagement features such as a plurality of wedges and curved surface edges couple the PnP cap 900 to the socket body 200. FIG. 6b depicts an isometric view of the socket assembly 1000 including the PnP cap 900, the socket body 200 and the loading plate 600 in the open position. The loading plate 600 and the lever 700 are mounted on the enabling frame 300. The enabling frame 300 is mounted on the PCB 800.

The enabling frame 300 with the central opening 302 (not shown in the figure) is mounted around the socket body 200. The screws 318 present on the enabling frame 300 screw into the holes such as the holes 802 (not shown) on the PCB 800. The loading plate 600 is pivotally hinged on the enabling frame 300, as shown in the figure. However, it will be apparent to a person ordinarily skilled in the art that the loading plate 600 can be pivotally hinged to the enabling frame 300 by making use of any other suitable design of the loading plate 600 and the enabling frame 300. The loading plate 600 is placed in the open position facilitated by the lever 700. The driving shaft 706 of the lever 700 includes the u-shaped portion 708 which is rotated to lift the protruding edge 702 of the closing shaft 704, thereby releasing the locking portion 608 of the loading plate 600. The loading plate 600 is then raised to assume the open position. The open position of the loading plate 600 facilitates the removal of the PnP cap 900 for inserting the IC package 804 (not shown in the figure) into the receiving space of the socket body 200. The PnP cap 900 can be easily removed from the socket body 200 due to the clearance and grip provided by the multiple chamfered portions such as the chamfered portion 920 disposed on the second plurality of latches 918 on the raised portion 904, as explained in conjunction with FIG. 5. Further, it will be apparent to a person ordinarily skilled in the art that the multiple chamfered portions, such as the chamfered portion 920, may be present on any other part of the raised portion 904 for providing clearance and grip to lift the PnP cap 900 easily without breaking the first plurality of latches of the PnP cap 900.

In accordance with an embodiment of the present disclosure, a socket assembly, such as the socket assembly 1000 including a socket body, such as the socket body 200, a PnP cap, such as the PnP cap 900 and a loading mechanism, such as the loading mechanism 500 is provided. The PnP cap is designed with chamfered features on a raised portion on an upper surface of the PnP cap. The chamfered features extrude out to facilitate detaching the PnP cap from the socket body. The chamfered features are present on a bottom surface of a protruding structure of the socket body which provides more holding area to human fingers for picking up the PnP cap. The PnP cap may be easily removed without damaging latches present on the PnP cap and without interference from an ILM mounted on the socket body. Further, the design of the PnP cap as disclosed requires minimal modifications to existing ILMs.

In accordance with an embodiment of the present disclosure, the low profile of the PnP cap permits design of the PnP cap to meet standard requirements of Joint Electron Device Engineering Council (JEDEC). The PnP cap 400 may be molded using polymer material such as liquid-crystal-polymer (LCP).

The foregoing descriptions of specific embodiments of the present disclosure have been presented for purposes of illustration and description. They are not intended to be exhaustive or to limit the present disclosure to the precise forms disclosed, and obviously many modifications and variations are possible in light of the above teaching. The embodiments were chosen and described in order to best explain the principles of the disclosure and its practical application, to thereby enable others skilled in the art to best utilize the present disclosure and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present disclosure.

What is claimed is:

1. A socket assembly for an Integrated Circuit (IC) package, the socket assembly comprising:
    a socket body capable of engaging the IC package, the socket body further capable of being mounted on a printed circuit board; and
    a Pick-and-Place (PnP) cap comprising an upper surface and a lower surface, the PnP cap capable of being detachably mounted on the socket body, the PnP cap further comprising:
        a raised portion configured on the upper surface of the PnP cap, the raised portion comprising multiple chamfered portions, wherein each of the multiple chamfered portions project out from the raised portion, and wherein the multiple chamfered portions enable detachment of the PnP cap from the socket body;
        wherein the raised portion further comprises a second plurality of latches projecting out from at least one lateral edge of the raised portion; and
        wherein at least one latch of the second plurality of latches comprises at least one chamfered portion of the multiple chamfered portions at a bottom surface of the at least one latch.

2. The socket assembly of claim 1, wherein the PnP cap comprises a first plurality of latches on a plurality of peripheral edges of the PnP cap for engaging the PnP cap with the socket body.

3. The socket assembly of claim 1 further comprising a loading mechanism capable of being mounted on the socket body, wherein the loading mechanism comprises a loading plate for loading the IC package.

4. The socket assembly of claim 1 further comprising an enabling frame capable of housing the socket body for surface mounting the socket body on the PCB.

5. The socket assembly of claim 1, wherein the raised portion on the upper surface of the PnP cap defines a stepped cavity on the lower surface of the PnP cap, the stepped cavity configured to provide a clearance area between the socket body and the lower surface of the PnP cap when the PnP cap is mounted on the socket body.

6. The socket assembly of claim 1, wherein the PnP cap is molded using a polymer material.

7. A socket assembly for an Integrated Circuit (IC) package, the socket assembly comprising:
- a socket body capable of engaging the IC package, the socket body further capable of being mounted on a printed circuit board; and
- a Pick-and-Place (PnP) cap comprising an upper surface and a lower surface, the PnP cap capable of being detachably mounted on the socket body, the PnP cap further comprising:
  - a raised portion configured on the upper surface of the PnP cap, the raised portion comprising multiple chamfered portions, wherein each of the multiple chamfered portions project out from the raised portion, and wherein the multiple chamfered portions enable detachment of the PnP cap from the socket body;
  - a first plurality of latches on a plurality of peripheral edges of the PnP cap for engaging the PnP cap with the socket body;
  - wherein the raised portion further comprises a second plurality of latches projecting out from at least one lateral edge of the raised portion; and
  - wherein at least one latch of the second plurality of latches comprises at least one chamfered portion of the multiple chamfered portions at a bottom surface of the at least one latch.

8. The socket assembly of claim 7, further comprising a loading mechanism capable of being mounted on the socket body, wherein the loading mechanism comprises a loading plate for loading the IC package.

9. The socket assembly of claim 7, further comprising an enabling frame capable of housing the socket body for surface mounting the socket body on the PCB.

10. The socket assembly of claim 7, wherein the raised portion on the upper surface of the PnP cap defines a stepped cavity on the lower surface of the PnP cap, the stepped cavity configured to provide a clearance area between the socket body and the lower surface of the PnP cap when the PnP cap is mounted on the socket body.

11. The socket assembly of claim 7, wherein the PnP cap is molded using a polymer material.

* * * * *